United States Patent [19]

Tanaka et al.

[11] Patent Number: 4,859,385

[45] Date of Patent: Aug. 22, 1989

[54] METHOD FOR MAKING A FURNACE COMPONENT

[75] Inventors: Takashi Tanaka; Yoshiyuki Watanabe, both of Oguni, Japan

[73] Assignee: Toshiba Ceramics Co., Ltd., Tokyo, Japan

[21] Appl. No.: 213,459

[22] Filed: Jun. 29, 1988

Related U.S. Application Data

[63] Continuation of Ser. No. 877,946, Jun. 24, 1986, abandoned.

[30] Foreign Application Priority Data

Jul. 9, 1985 [JP] Japan .................. 60-149345

[51] Int. Cl.$^4$ .............. B29C 71/00; C04B 35/56; C04B 35/64; C04B 41/81
[52] U.S. Cl. .................. 264/62; 264/63; 264/66; 264/344; 501/88
[58] Field of Search .............. 264/60, 62, 63, 65, 264/44, 43, 82, 344, 56, 66; 501/88

[56] References Cited

U.S. PATENT DOCUMENTS

| | | | |
|---|---|---|---|
| 2,907,972 | 10/1959 | Schildhauer et al. | 501/88 X |
| 3,495,939 | 2/1970 | Forrest | 264/65 |
| 3,947,550 | 3/1976 | Fitchmun | 264/63 X |
| 3,951,587 | 4/1976 | Alliegro et al. | 432/253 |
| 4,233,256 | 11/1980 | Ohnsorg | 264/44 |
| 4,385,020 | 5/1983 | Morelock | 264/62 |
| 4,482,512 | 11/1984 | Alsop | 264/60 |
| 4,510,191 | 4/1985 | Kagami et al. | 264/60 X |
| 4,532,091 | 7/1985 | Dias et al. | 264/60 X |
| 4,564,496 | 1/1986 | Gupta et al. | 501/88 X |
| 4,619,798 | 10/1986 | Tanaka et al. | 264/62 |
| 4,668,452 | 5/1987 | Watanabe et al. | 264/65 X |
| 4,671,912 | 6/1987 | Komatsu et al. | 264/65 X |
| 4,693,988 | 9/1987 | Boecker et al. | 264/65 X |
| 4,747,863 | 5/1988 | Clasen et al. | 264/56 X |
| 4,753,763 | 6/1988 | Tanaka et al. | 264/82 X |

*Primary Examiner*—Jan H. Silbaugh
*Assistant Examiner*—Karen D. Kutach
*Attorney, Agent, or Firm*—Wegner & Bretschneider

[57] ABSTRACT

A method for making a component for a semi-conductor diffusion furnace by blending two types of silicon carbide powders, that is, 10 parts by weight of intermediate silicon carbide having an average particle size of 10–30 microns and 10–25 parts by weight of coarse silicon carbide having an average particle size of 80–200 microns, thereby to make a mixture, admixing an organic binder with the mixture, thereafter granulating the mixture thereby to produce pellets, preforming the pellets by a rubber press thereby to produce a formed body, presintering the formed body thereby to produce a presintered body, and impregnating the presintered body with silicon and simultaneously sintering it.

8 Claims, 1 Drawing Sheet

100 μm

100 μm

METHOD FOR MAKING A FURNACE COMPONENT

This application is a continuation of United States application Ser. No. 877,946, filed June 24, 1986 now abandoned.

BACKGROUND OF THE INVENTION

This invention relates to a method for manufacturing a furnace component such as a process tube for a semi-conductor diffusion furnace.

U.S. Pat. No. 3,951,587 discloses semi-conductor diffusion furnace components such as a process tube, paddle and boat consisting essentially of a sintered silicon carbide matrix resulting from the sintering of silicon carbide powder which is made up of approximately 50% by weight of fine silicon carbide having an average particle size of 0.1–8 microns and 50% by weight of coarse silicon carbide having an average particle size of 30–170 microns.

In such semi-conductor diffusion furnace components, since the fine silicon carbide powder has an average particle size of from 0.1–8 microns, the surface areas of the powders is large enough so that impurities can be easily caught thereby.

Also, density and chemical purity of a formed body are important factors for semi-conductor diffusion furnace components.

In general, silicon carbide powder is milled by a vibration type mill or the like and then sieved to thereby yield a starting material having desired particle sizes. During the milling process, however, many impurities are caught to such a degree that silicon carbide powder so produced cannot be suitably used for the purpose of manufacturing high quality semi-conductor diffusion furnace components. Thus, purification treatment such as acid treatment is applied to the silicon carbide. Even with this treatment, however finer powder remains relatively contaminated and cannot be easily purified. For such a reason, it is preferable to use coarse silicon carbide powder from to achieve high quality components. However, if only coarser silicon carbide powder is used, sufficient density and strength for a process tube cannot be obtained.

SUMMARY OF THE INVENTION

The object of this invention is to provide a method for making a semi-conductor diffusion furnace component such as a process tube which can be easily carried out and in which physical properties and in particular mechanical strength can be improved.

According to this invention, two type silicon carbide powders are used which consist essentially of coarse silicon carbide powder and intermediate silicon carbide powder. Fine silicon carbide powder is not used.

The intermediate silicon carbide powder has an average particle size of 10–30 microns. The coarse silicon carbide powder has an average particle size of 40–200 microns. No fine silicon carbide powder having an average particle size less than 10 microns is used.

Further, 10 parts by weight of intermediate silicon carbide powder and 10–25 parts by weight of coarse silicon carbide powder are blended and mixed with an organic binder such as phenol resin, polyvinyl alcohol or tar pitch thereby to produce a mixture.

Such a mixture is granulated or pelletized so as to obtain pellets and then preformed by a rubber press in the shape of a furnace component such as a process tube thereby to obtain a formed body. It is presintered at a temperature of 800°–1200° C. thereby to obtain a presintered body. The presintered body is impregnated with silicon at a temperature of 1500°–1800° C. for silicidation of the body. It is substantially simultaneously sintered at a temperature of 1500°–1800° C. The presintered body is preferably purged by chlorine gas at a temperature of 1000°–1800° C. so as to be purified prior to the impregnation step whereby a high quality process tube can be obtained.

According to this invention, no fine silicon carbide powder is used, and a component for a semi-conductor diffusion furnace is produced from two types of silicon carbide powders each having larger average particle sizes than those of the prior art components. Also, the two types of silicon carbide powders have relatively small surface areas, such that they can be easily purified in a shorter length of time, and contain fewer impurities.

According to this invention, the presintered structure has preferred porosity suitable for impregnation with silicon so that it can be sufficiently strengthened. After presintering thereof, no defects such as imperfect pores are present. Accordingly, a homogeneous Si-SiC microstructure having a high strength can be obtained.

In addition, both types of silicon carbide powders having relatively large particle sizes can be easily granulated or pelletized at a high efficiency. Thus, production costs can be decreased while quality is stabilized.

Such advantages are further remarkably increased if the two types of silicon carbide powders are formed by a rubber press.

On the basis of 10 parts by weight of intermediate powder, if coarse powder is present in less than 10 parts, large amounts of impurities are caught so that purification is difficult, coarse powder is present in more than 25 parts, the desired mechanical strength cannot be easily obtained.

EXAMPLE 1

A process tube for a semi-conductor diffusion furnace is manufactured as follows:

A mixture is first prepared from the following combination of materials:

(a) intermediate silicon carbide powder such as green carborundum having an average particle size of 20 microns ....10 parts by weight; and (b) coarse silicon carbide powder such as green carborundum having an average particle size of 150 microns ..... 10 parts by weight.

The mixture is admixed with phenol resin and thereafter granulated thereby to produce pellets in a well-known manner. After such pellets are dried, they are formed in the shape of a process tube by means of a conventional rubber press. If desired, it is machined or adhered to another part. After that, it is presintered at a temperature of 1000° C. thereby to obtain a presintered body, and then it is purged by chlorine gas at a temperature of 1500° C. so as to be purified. Such a presintered and purified body is impregnated with silicon at 1,700° C. for the silicidation of the body. It is substantially simultaneously sintered at a temperature of 1,700° C. thereby to obtain a sintered body. If desired, it is finally finished by grinding a surface thereof.

Figure 1:
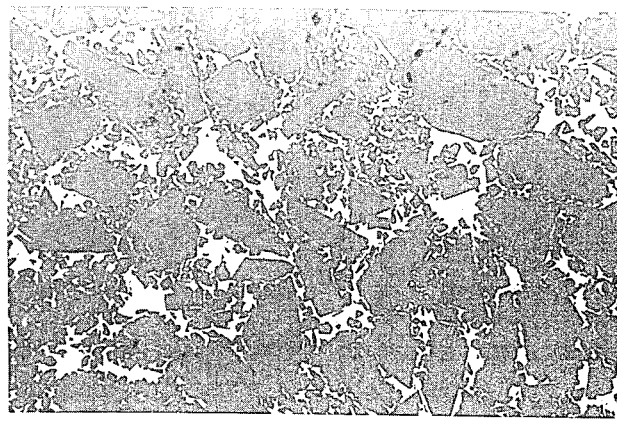
FIG. 1 is a micro-photograph showing a microstructure of a process tube for a semi-conductor diffusion furnace manufactured according to this invention.
Figure 2:
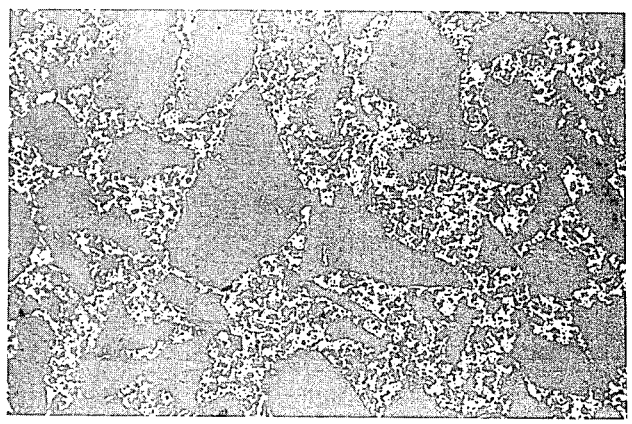
FIG. 2 is a micro-photograph showing a microstructure of a conventional process tube.

A microstructure of the process tube so produced is shown in FIG. 1. A microstructure of a process tube manufactured according to the method of U.S. Pat. 3,951,587 is shown in FIG. 2.

According to this invention, physical properties of a process tube are as follows:

Bulk Density..............2.8–3.0 g/cc
Strength..................190 MPa

I claim:

1. A method for making a component for a semi-conductor diffusion furnace, comprising the steps of:
   (a) obtaining, as separate powders, (i) intermediate silicon carbide having an average particle size of 10–30 microns and (ii) coarse silicon carbide having an average particle size of 40–200 microns;
   (b) blending about 10 parts by weight of the intermediate silicon carbide powder and about 10–25 parts by weight of the coarse silicon carbide powder to form a mixture;
   (c) admixing an organic binder with the mixture;
   (d) thereafter granulating the mixture thereby to produce pellets;
   (e) preforming the pellets by a rubber press thereby to produce a formed body;
   (f) presintering the formed body thereby to produce a presintered body;
   (g) impregnating the presintered body with silicon; and
   (h) sintering the presintered body, to produce a high quality component for a semi-conductor diffusion furnace having a homogeneous Si-SiC microstructure, and improved mechanical strength and physical characteristics.

2. The method of claim 1, wherein the formed body is presintered at a temperature of 800°–1200° C.

3. The method of claim 1, wherein the presintered body is impregnated with silicon at a temperature of 1500°–1800° C.

4. The method of claim 1, wherein the presintered body is sintered at a temperature of 1500°–1800° C.

5. The method of claim 1, wherein the impregnating step is simultaneous with the sintering step.

6. The method of claim 5 wherein the coarse silicon carbide has an average particle size of 80–200 microns.

7. The method of claim 1, wherein the presintered body is purged so as to be purified prior to the impregnating step.

8. The method of claim 7, wherein the presintered body is purged at a temperature of 1000°–1800° C.

* * * * *